United States Patent [19]

Krause et al.

[11] Patent Number: 5,015,538
[45] Date of Patent: May 14, 1991

[54] PROCESS FOR PULSE ELECTROPLATING ELECTROACTIVE POLYMERS AND ARTICLES DERIVED THEREFROM

[75] Inventors: Larry J. Krause; Nena M. McCallum, both of St. Paul, Minn.

[73] Assignee: Minnesota Mining and Manufacturing Company, St. Paul, Minn.

[21] Appl. No.: 411,109

[22] Filed: Sep. 22, 1989

[51] Int. Cl.$^5$ .................... C25D 5/10; C25D 5/56
[52] U.S. Cl. .................... 428/626; 204/15; 204/30; 204/38.1; 204/38.4; 204/40; 204/DIG. 9; 428/646; 428/647; 428/669; 428/672; 428/675; 428/935; 430/314
[58] Field of Search .............. 204/20, 30, 38.1, 38.4, 204/40, 15, DIG. 9; 430/314; 428/624, 626, 646, 647, 669, 672, 675, 901, 935

[56] References Cited

U.S. PATENT DOCUMENTS

| | | | |
|---|---|---|---|
| 4,512,855 | 4/1985 | Mazur | 204/22 |
| 4,710,403 | 12/1987 | Krause et al. | 427/304 |
| 4,775,556 | 10/1988 | Krause et al. | 427/272 |
| 4,830,903 | 5/1989 | Levy | 204/22 X |

OTHER PUBLICATIONS

"Pulse-Plated Gold," Plating and Surface Finishing, C. J. Raub and A. Knodler, pp. 32-33.
"An Overview of Pulse Plating," Plating and Surface Finishing, Norman M. Osero, Mar., 1986, pp. 20-22.
P. G. Pickup et al., Electrodeposition of Metal Particles and Films by a Reducing Redox Polymer, *J. Electrochem. Soc.*, vol. 130, No. 11, 1983, pp. 2205-2216.

Primary Examiner—John F. Niebling
Assistant Examiner—William T. Leader
Attorney, Agent, or Firm—Donald M. Sell; Walter N. Kirn; Mark A. Litman

[57] ABSTRACT

The invention consists of a process for pulse electroplating electroactive polymer substrates at potentials sufficient to cause reduction of the substrates. The inventive process can be used to make polymer-metal composites having one or more metal films. More specifically, it can be used to electroplate polyimide substrates with gold, or to electroplate gold over a copper plated polyimide substrate. These inventive composites exhibit improved polymer-metal adhesion when they are exposed to elevated temperatures and humidities, i.e., 85° C. and 85% R.H.

18 Claims, No Drawings

PROCESS FOR PULSE ELECTROPLATING ELECTROACTIVE POLYMERS AND ARTICLES DERIVED THEREFROM

FIELD OF THE INVENTION

The invention relates to a process for pulse electroplating an electroactive polymer substrate at a potential sufficient to cause reduction of the substrate and to articles derived from said substrates.

BACKGROUND OF THE INVENTION

Metallized organic polymers are utilized in numerous applications requiring conductive or reflective coatings. Metallized films of polyimides (PIm), which have superior thermal stability and dielectric properties, are particularly desirable in the fabrication of flexible printed circuits, and the associated packages and the interconnectors required to assemble microelectronic systems. Conductive connector tapes such as those used in the Tape Automated Bonding (TAB) process described in U.S. Pat. No. 4,472,876 typically have a final electroplated gold layer to facilitate the thermocompressive bonding operation whereby the TAB connector tape is bonded to integrated circuit connector (IC) pads. Thermocompressive bonding processes described in U.S. Pat. No. 4,494,688 require a pure gold layer that is soft and capable of forming strong and durable bonds with the metal comprising the IC pads. Therefore the gold layer must be free of other metals such as arsenic and thallium that can increase its hardness.

A major concern in the electroplating of polyimide substrates for electronic applications is the adhesion of the metal film to the polyimide substrate. The film must stay well-adhered to the substrate not only through the plating and selective etching processes used to form the patterned metal films which comprise the microcircuitry, but also in end-use environments which often include extremes of temperature and humidity. These plating and etching processes take place in highly ionized electrolyte solutions containing ions with high mobilities.

Polyimide substrates containing the pyromellitimide group in the polymer backbone are electroactive. Electroactive (EA) groups, also called redox and charge transfer centers, are described in Haushalter and Krause (Thin Solid Films, 102, 1983, 116–171 "Electroless Metallization of Organic Polymers Using the Polymer as a Redox Reagent: Reaction of Polyimide with Zintl Anions") and disclosed in U.S. Pat. No. 4,775,556 column 5, line 24 through column 7, line 2. In these references the PIm nucleus is reduced electrolessly by using Zintl salts and various chemical reducing agents, and the patent further discloses the utility of such electroactive groups in the electroless deposition of various metallic films. This utility is further disclosed in U.S. Pat. Nos. 4,710,403 and 4,459,330. It is also possible to reduce electroactive nuclei electrolytically in conjunction with electroplating process performed at potentials more negative than the reduction potential of the electroactive nucleus. It has now been recognized that electrolytically reduced EA nuclei can cause problems with the adhesion of electroplated metal films.

U.S. Pat. No. 4,775,556 discloses at column 4, lines 27–40, that "Along with the reduction of the polyimide film is the concomitant diffusion of the counter cation into the film. The size of the counter cation appears to be very important. Alkali metals freely diffuse into the film as reduction proceeds. Intermediate sized quaternary ammonium cations such as tetramethyammonium and tetraethylammonium do diffuse into the polyimide film and reduction of the film to produce a deeply colored radical anion film occurs. However, the ammonium cation appears unstable as the counter cation. This is indicated by a gradual fading of the film color to lighter shades of green."

A commercial ammonium gold cyanide electroplating solution containing arsenic known as Part # 1EHS29 is available from Englehard Corp., Speciality Chemical Division, East Newark, NJ. This solution is specially formulated for use in wire coating applications where the addition of arsenic as a grain refiner to gold electroplating solutions increases process speed and therefore provides an economic advantage over non-arsenic containing electroplating solutions.

This arsenic containing gold electroplating solution is totally unsuitable for use in the present invention because the arsenic would sufficiently harden the gold thus making it unsuitable for thermocompression bonding.

No prior art of which we are aware teaches the utility of the ammonium ion as a charge compensating counter cation capable of preventing the electrochemical reduction of electroactive substrates in electroplating processes conducted at potentials more negative than the reduction potential of such substrates.

SUMMARY OF THE INVENTION

In its simplest form, the invention consists of a process for electroplating electroactive polymer substrates at potentials sufficient to cause reduction of the substrates. The inventive process can be used to make polymer-metal composites having one or more metal films. More specifically it can be used to electroplate polyimide substrates with gold, or to electroplate gold over a copper plated polyimide substrate. These inventive composite articles exhibit improved polymer-metal adhesion when they are exposed to elevated temperatures and humidities, i.e. 85° C. and 85% R.H. The process comprises the steps of:

(a) providing an electroactive polymer substrate bearing a first metal layer;

(b) electroplating one or more metals selected from a first group of metals that are reduced at potentials more positive than the reduction potential of the electroactive polymer substrate such as copper and tin;

(c) pulse electroplating one or more metals selected from a second group of metals that are reduced at potentials more negative than the reduction potential of the electroactive polymer substrate in a plating solution having charge compensating counter cations wherein the charge compensating counter cations are incapable of sustaining the flux necessary to balance the flow of electrons through the metallized surface which reduce the electroactive centers in the polymer substrate either through insulated transport or electron blocking, said plating solution having an arsenic concentration of less than 5 ppm and most preferably less than 1 ppm, and an alkali metal ion concentration of less than 10 ppm, preferably less than 4000 ppm, preferably less than 2000 ppm, more preferably less than 100 ppm, and most preferably less than 10 ppm.

It is surprising and unexpected that the use of unstable ammonium ions as the charge compensating counter cation in electroplating solutions prevents reduction of electroactive substrates and can impart long term adhesion to the plated composites in high temperature, high humidity end use environments.

The invention extends to articles formed from composite materials made using the process of the invention.

An especially preferred embodiment of the invention is a process for making gold plated connector tapes useful in the thermocompressive bonding of integrated circuit elements using the Tape Automated Bonding (TAB) process. The novel micro-interconnector is comprised of a polyimide substrate and one or more metal films, which interconnector has improved adhesion between the substrate and first metal film upon exposure to a temperature of 85° C. and a relative humidity of 85%. The process steps comprise:

(a) providing a polyimide substrate having two major surfaces;

(b) sputtering or otherwise applying on said substrate a thin film of chromium oxide, CrOx, on a first major surface of said substrate;

(c) sputtering or otherwise applying upon the surface of the chromium oxide a thin layer of copper metal;

(d) electroplating a thin layer of copper metal upon the surface of the sputtered copper layer to form a copper base layer on the first major substrate surface;

(e) etching said copper layer with acid to roughen the copper surface (which is often bright or shiny);

(f) laminating to both major substrate surfaces a photoresistive film;

(g) imagewise exposing said resistive film(s) to actinic radiation to form an image which can be resistively developed as by placing a mask in contact with photoresistive film on the first major substrate surface, said mask having areas defined thereon comprising the patterns for electrically conductive circuitry;

(h) imagewise exposing said resistive film(s) to actinic radiation to form an image which can be resistively developed as by placing a mask in contact with photoresistive film on the second major substrate surface, said mask having areas defined thereon corresponding to areas of the substrate to be dissolved during chemical milling;

(i) exposing said photoresistive films on both major substrate surfaces to a source of actinic (e.g., ultraviolet) radiation;

(j) developing said photoresistive films to remove the photoresistive film in those areas which are to be subsequently electroplated with copper or chemically milled;

(k) etching the exposed copper base layer on the first major substrate surface to remove residual organic materials; exposing areas of crOx (l) electroplating additional copper in the exposed areas of the copper base layer on the first major substrate surface, said patterned copper (sometimes described as tracings or traces) defining, the electrically conductive areas on the first major substrate surface;

(m) chemically milling the patterned areas on the second major substrate surface to remove the polyimide, said milling solution, for example, consisting essentially of or comprising a concentrated solution of aqueous potassium hydroxide;

(n) stripping the remaining photoresist from both major substrate surfaces;

(o) etching exposed copper surfaces on the first major substrate surface to remove residual organic materials;

(p) etching exposed areas of CrOx to remove it from the first major substrate surface in said exposed areas;

(q) pulse electroplating gold on exposed copper surfaces at a potential more negative than the reduction potential of the electroactive pyromellitimide nucleus of the polyimide substrate in a solution wherein the charge compensating counter cations are incapable of sustaining the charge necessary to balance the flow of electrons through the metallized surface which reduce the electroactive centers in the polymer substrate, said plating solution having a concentration of alkali metal ions of less than 4000 ppm and a concentration of arsenic ions of less than 10 ppm, said pulse electroplating process having a duty cycle in the range of 5% to 50%, preferably in the range 10% to 20%.

DETAILED DESCRIPTION OF THE INVENTION

It is now known that electroactive (EA) polymer substrates can be reduced when they are electroplated at potentials more negative than the reduction potential of the electroactive nuclei. Two conditions are necessary for electrochemical reduction of the substrate to occur: (1) an appropriate thermodynamic electrical potential must be applied, and (2) a source of charge compensating ions with sufficient flux through the substrate must be available to preserve charge neutrality. Hydrated alkali metal ions are effective charge compensating cations because they are sufficiently small and mobile. Conversely, if the charge compensating cations can not migrate to the electroactive polymer nuclei during electroplating process, then electrochemical substrate reduction can not occur.

When electroactive (EA) substrates are electroplated at sufficiently negative potentials in solutions containing alkali metal ions, substrate reduction occurs. The alkali metal salt of the EA nucleus is formed during reduction and is readily oxidized by atmospheric oxygen in the presence of adsorbed water to form four moles of hydroxide ion per mole of alkali metal EA salt.

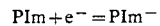

$$PIm + e^- = PIm^- \quad [1]$$

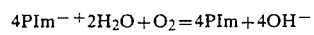

$$4PIm^- + 2H_2O + O_2 = 4PIm + 4OH^- \quad [2]$$

the hydroxide ion reacts further causing a catastrophic loss in adhesion of the electroplated metal films. Without being bound by the exact/precise nature of the mechanism, the loss in adhesion is presumed to be due to hydrolysis of imide linkages at the substrate/metal interface. The hydrolysis and loss of adhesion is accelerated in high temperature, high humidity environments (85° C., 85% R.H.).

The following are examples of types of polyimides containing the electroactive pyromellitimide nucleus which can be used to practice the invention. Polyimides derived from poly(4,4'-oxydiphenylenepyromellitimide) also known as "Kapton" available from E.I. duPont Chemical Co., Inc. and "Apical" made by Kanegafuchi Chemical Industries Co. Ltd., Japan, and available in the U.S. from Allied-Signal Corp., Morristown, NJ. Polyimides derived from the reaction of pyromellitic dianhydride and mixtures of oxydianiline and para-phenylene diamine known as "Apical NPI".

Polyimides in which the imide groups are attached to a napthalene instead of a benzene nucleus are also readily reduced electrolytically. Therefore polyimides derived from 2,3,6,7-napthyltetracarboxydianydride and diamines such as oxydianiline and para-phenylene diamine can also be used to practice the invention.

Alkali metal containing gold cyanide plating solutions are commercially available from Englehard Corp., East Newark, NJ, and American Chemical & Refining Co., Inc. of Waterbury, CT. The alkali metals in these plating solutions are removed and replaced with ammonium ions using cation ion exchange resins, a general process that is well known in the art.

Other alkali metal free water soluble gold complexes can be used to practice the invention. These complexes include the (chlorides, bromides, and thiosulfate complexes).

The gold concentration in the electroplating solution is usually from 5 to 20 grams per liter and preferably from 13 to 15 grams per liter.

The following charge compensating counter ions are examples of those that can be used to practice the invention: ammonium; and the tetra-alkyl ammonium ions selected from the group consisting of tetraethyl ammonium, tetrapropyl ammonium, tetrabutyl ammonium, and tetrapentyl ammonium. Ammonium is especially preferred. While the prior art teaches that intermediate sized tetraalkyl ammonium cations, such as tetramethyl ammonium and tetraethyl ammonium, are capable of diffusing into polyimide films, the Table I entry for tetraethyl ammonium (TEA) ion shows there is a voltage dependence as well as size dependence that affects the mobility of the TEA charge compensating cation. The TEA cation is not effective in preventing substrate reduction at voltages more negative than -600 mv (versus a silver/silver chloride reference electrode). The tetramethyl ammonium cation is not preferred for the present invention at any voltage more negative than the reduction potential of the polyimide film. The preferred ammonium ion is small and highly mobile. Its effectiveness in the present invention is believed to reside in the instability of the $PIm^{-(NH_4)+}$ salt which rapidly decomposes into a non-electroactive form of PIm.

The ammonium salts useful in preparing the electrolyte and buffer solutions needed to increase the conductance and stability of the electroplating solution are, for example, dibasic ammonium citrate, monobasic ammonium phosphate, ammonium sulfamate, and boric acid. A preferred electrolyte solution is comprised of:

| Di-basic ammonium citrate | $(NH_4)_2HC_6H_5O_7$ | 164 g/l |
|---|---|---|
| Mono-basic ammonium phosphate | $(NH_4)H_2PO_4$ | 41 g/l |
| Boric Acid | $H_3BO_3$ | 8.2 g/l |

Critical Process Variables

Many of the process variables of the inventive gold electroplating process are controlled and related to one another by the cell geometry.

Typical electroplating potentials are in the range of −200 to −1500 millivolts versus a silver-silver chloride reference electrode. The pH of electroplating solution is generally in the range of 5 to 7 and preferably from 6.0 to 6.5. The solution temperature is generally in the range of 50 to 75° C. and preferably 65 to 75° C. The plating bath must be vigorously agitated in order to minimize the concentration gradients that occur at the electrode surfaces.

Pulse plating can also be used to increase plating current density without producing large concentration gradients as is well known in the electroplating art. When pulse plating is used in practicing the present invention, a duty cycle of from 5 to 50% and preferably 10 to 20% has been effective.

The photolithographic, etching, electroplating, chemical milling processes well known in the art which are used to make the TAB parts are described in detail in U.S. Pat. Nos. 3,981,691, 3,832,769, and 3,691,289, which are hereby incorporated for reference.

TEST PROCEDURES

In the following test methods and examples "DI water" means deionized water having a resistance of 18 megaohms.

Boiling Water Test

The boiling water test is an accelerated aging test which predicts the adhesion of metal films to electroactive polymer substrates in a high temperature, high humidity environment of 85° C./85% R.H.

Test specimens are typically TAB parts of the following size: 3.5 cm×7.0 cm or 7.0 cm×7.0 cm.

Procedure:
(1) Deionized water (500 ml) was brought to a boil in a 600 ml beaker using a hot plate equipped with magnetic stirrer.
(2) The specimens were suspended from a glass hook in the boiling water and boiled for 20 +/−1 minutes.
(3) The specimens were removed from the boiling water and dried with jet of clean air.
(4) The TAB leads were cut free with a scissors and examined with an 80 × microscope.
(5) Tweezers were used to pull selected leads free from the PIm backing noting the force required to effect separation.
(6) Specimens that failed the test were those where the metal leads separated easily and clean PIm substrate leaving only a faint outline of the previously attached metal lead.
(7) Specimens that pass the test were those where the metal leads caused cohesive fracture of the PIm surface, leaving areas on the PIm surface where polymer was "torn out" and there was a clearly visible outline of the edges of the absent electroplated conductors which were removed.

Potentiostat Test

The potentiostat test is a screening test which can be used to rapidly determine if any given charge compensating counterion is sufficiently mobile to diffuse to the PIm - metal interface thus permitting reduction of the polymer surface when electroplating potentials are more negative than reduction potential of the PIm electroactive nucleus. Such a screening test is highly desirable because of the high cost of doing "trial & error" test using gold plating solutions and the difficulty of preparing electrolyte solutions free of substantial amounts of alkali metal ions.

The test specimens were a TAB part with the dimensions noted above.
(1) Test solutions of varying concentration were prepared by dissolving the appropriate weight of the salt in deionized water.

(2) The test solution (60 ml in a 100 ml beaker) was heated to 65 +/−1° C. on a hot plate equipped with magnetic stirrer.

(3) The test specimens were attached to a conductive clamp and the electrical lead from the specimen clamp is connected to a constant voltage source and the output voltage adjusted to the potential selected for the test, i.e. −400, −600, or −1,200 millivolts versus a silver-silver chloride reference electrode.

(4) The potentiostatic condition was maintained for 10 minutes after which the specimens were removed from the electrolysis cell and rinsed with DI water and dried with a jet of clean air.

(5) The PIm was examined using an 80 × microscope to see if it had been reduced--the presence and intensity of the distinctive green color of PIm- was noted.

(6) The specimens were then subjected to the boiling water test described above.

The results of the potentiostat tests are shown in Table 1.

EXAMPLES

EXAMPLE 1

Preparation of the ammonium dicyanoaurate (I) electro-plating solution

An ion exchange resin column was prepared by slurry packing a standard glass ion exchange burette, which had been repeatedly rinsed with DI water, with 75 ml of cationic ion exchange resin to form an air free resin bed approximately 20 cm in height. The cation exchange resin was analytical grade Bio Rad AG 50W-X8 with a capacity of 5.1 milliequivalents per gram of dry resin or 1.7 milliequivalents per ml of resin bed available from Bio Rad Laboratories, Richmond, CA. The resin bed was pre-rinsed with 100 ml of DI water followed with a rinse of 300 ml of 1N ammonium hydroxide, followed by a post-rinse of 150 ml of DI water which converted the resin to its ammonium form.

A saturated solution of potassium dicyanoaurate (I) was prepared by dissolving 5 grams of the aurate salt available from Aldrich Chemical Co. Inc., Milwaukee, WI, in about 30 ml of DI water. This solution was transferred to the head of the ion exchange column and eluted with 150 ml of DI water. The eluate was collected in a 200 ml beaker and reduced to 50 ml by evaporation on a temperature controlled hot plate at a temperature of less than 50° C. to prevent the evolution of ammonia and precipitation of gold.

All of the elutions and rinses were done at a flow rate of about 1 ml per minute and were terminated when the meniscus was 1 cm above the head of the resin bed.

The evaporated eluate was transferred to a 100 ml volumetric flask and diluted to the mark with DI water to provide a 0.17 M ammonium dicyanoaurate (I) solution.

EXAMPLE 2

Electroplating of TAB parts with gold

A 75 micron thick strip of an aromatic polyimide (available under the Kapton trademark) which was pre-metallized with 150 nm thick layer of copper by vacuum sputtering was used as the substrate in this example. This substrate was electroplated with a 35 micron thick layer of copper using a commercial copper electroplating process, for example, those of Shipley Co. Inc., Newton, MA, as is well known in the art. The potentials used in the course of this copper electroplating process were more positive than the reduction potential of the Kapton film.

The resulting PIm/copper/copper composite was electroplated with a 0.8-2.5 micron thick gold film using a buffered, arsenic free, ammonium gold cyanide electroplating solution of the following composition:

| Buffer | | |
|---|---|---|
| Di-basic ammonium citrate | $(NH_4)_2HC_6H_5O_7$ | 164 g/l |
| Mono-basic ammonium phosphate | $(NH_4)H_2PO_4$ | 43 g/l |
| Boric Acid | $H_3BO_3$ | 8.2 g/l |
| Arsenic Free Gold | | |
| ammonium dicyanoaurate (I) | $(NH_4)Au(CN)_2$ | 15 g/l | at a current density of from 5-250 Amperes per square meter preferably from 20 to 110 Amperes per square meter. Typical electroplating potentials are in the range of −200 to −1500 millivolts versus a silver-silver chloride reference electrode.

TABLE 1

| Electrolyte | Molarity | Bias (mv) | PIm | Adhesion Following Boiling Water Test |
|---|---|---|---|---|
| LiCl | 1M | −1200 | Extensive Pim | Adhesion damage, loss of fracture where Pim has formed |
| LiCl | 1M | −850 | None observed | Adhesion damage, loss of fracture in line width |
| LiCl | 1M | −400 | None observed | Adhesion good, most lines show total line width fracture |
| KCl | 1M | −1200 | Extensive formation | Massive loss of adhesion. No PIm fracture, edges of metal are gone |
| KCl | 1M | −850 | A few small spots & a thin edge | Adhesion damage, narrow line of PIm fracture left, extensive line undercut |
| KCl | 1M | −600 | None observed | Severe adhesion damage, most PIm fracture gone |
| KCl | 1M | −400 | None observed | Adhesion damage, some PI fracture remains, width of fracture is less than metal line |
| NH4Cl | 1M | −1200 | None observed | Adhesion good, PI fractures well after peel |
| NH4Cl | 1M | −850 | None observed | Adhesion good, PI fractures well over total line width |
| NH4Cl | 1M | −400 | None observed | Adhesion good, PI fractures well over total line width |
| NaCl | 1M | −1200 | Extensive Pim formation | Severe adhesion damage, no PI fracture left |
| NaCl | 1M | −850 | None observed | Adhesion damage, extensive line under- |

TABLE 1-continued

| Electrolyte | Molarity | Bias (mv) | PIm | Adhesion Following Boiling Water Test |
|---|---|---|---|---|
| | | | | cut |
| NaCl | 1M | −600 | None observed | Adhesion severly damaged, virtually no fracture left |
| NaCl | 1M | −400 | None observed | Adhesion marginal, most lines have good PI fracture left |
| TEABr | 1M | −1200 | Extensive Pim formation | Severe adhesion damage, no PIm fracture left |
| TEABr | 1M | −850 | Very thin edge of Pim observed | Severe adhesion loss |
| TEABr | 1M | −600 | None observed | Adhesion good, PIm fractures well across line width |
| TEABr | 1M | −400 | None observed | Adhesion good |

TEABr = Tetraethyl ammonium bromide

We claim:

1. A process for forming a composite comprising an electroactive polymer substrate comprising electroactive nuclei and a plurality of metal films, said composite having improved adhesion between the substrate and first metal film upon exposure to a temperature of 85° C. and a relative humidity of 85%, said process comprising the steps of:
   (a) providing an electroactive polymer substrate bearing on at least one surface a conductive layer of a first metal;
   (b) electroplating one or more metals selected from a first family of metals that are reduced at potentials more positive than the reduction potential of the electroactive polymer substrate;
   (c) pulse electroplating one or more metals selected from a second family of metals that are reduced at potentials more negative than the reduction potential of the electroactive nuclei in a plating solution having charge compensating counter cations wherein the charge compensating counter cations are incapable of sustaining the necessary flux of electrons through the metallized surface to reduce the electroactive nuclei in the polymer substrate, said plating solution having a concentration of alkali metal ions of less than 4000 ppm and a concentration of arsenic ions of less than 10 ppm.

2. The process of claim 1 wherein the first family of metals are selected from the group consisting of copper and tin.

3. The process of claim 1 wherein the second family of metals are selected from the group consisting of gold, platinum, palladium, and nickel.

4. The process of claim 1 wherein the electroactive nuclei of the polymer substrate are pyromellitimide.

5. The process of claim 1 wherein the electroactive nuclei are reduced at a potential of −200 millivolts versus a silver/silver chloride reference electrode.

6. The process of claim 1 wherein the charge compensating counter cation is an ammonium ion.

7. The process of claim 1 wherein the charge compensating counter cation is a tetra-alkyl ammonium ion selected from the group consisting of tetraethyl ammonium, tetrapropyl ammonium, tetrabutyl ammonium, and tetrapentyl ammonium ions.

8. The process of claim 1 wherein the the first metal layer comprises a metal which is selected from the group consisting of copper and tin.

9. The process of claim 1 wherein the first metal layer is deposited by vacuum sputtering.

10. The process of claim 1 wherein the first metal layer is deposited by electroless plating.

11. A process for making a micro interconnect article for the tape automated bonding system, said article comprising a polyimide substrate comprising electroactive nuclei and a plurality of metal films, said interconnect article having improved adhesion between the substrate and first metal film upon exposure to a temperature of 85° C. and a relative humidity of 85%, said process comprising the steps of:
   (a) providing a polyimide substrate having two major surfaces;
   (b) sputtering thereon a thin film of a chromium oxide on the first major surface of said substrate;
   (c) sputtering upon the surface of the said chromium oxide a thin layer of copper metal;
   (d) electroplating a thin layer of copper metal upon the surface of the sputtered copper layer to form a copper base layer on the first major substrate surface;
   (e) etching said copper layer with acid to roughen the copper surface;
   (f) laminating to both major substrate surfaces a photoresistive film;
   (g) imagewise exposing said photoresistive films on both major substrate surfaces to respective imagewise sources of actinic radiation;
   (h) developing said photoresistive films to remove the photoresistive film in those areas which are to be subsequently electroplated with copper or chemically milled;
   (i) etching the exposed copper base layer on the first major substrate surface to remove residual organic materials;
   (j) electroplating additional copper in the exposed areas of the copper base layer on the first major substrate surface, said patterned copper defining electrically conductive areas on the first major substrate surface;
   (k) chemically milling the patterned areas on the second major substrate surface to remove the polyimide;
   (l) stripping the remaining photoresist from both major substrate surfaces;
   (m) etching exposed copper surfaces on the first major substrate surface to remove residual organic materials; exposing areas of chromium oxide
   (n) etching exposed areas of chromium oxide to remove it from the first major substrate surface in said exposed areas;
   (o) pulse electroplating gold on exposed copper surfaces at a potential more negative than the reduction potential of the electroactive pyromellitimide nuclei of the polyimide substrate in a solution contains compensating counterions wherein the charge compensating counter cations are incapable of sustaining the necessary charge of electrons through the metallized surface to reduce the electroactive nuclei in the polymer substrate, said plating solution having a concentration of alkali metal ions of less than 4000 ppm and a concentration of arsenic ions of less than 10 ppm, said pulse electroplating process having a duty cycle in the range of 5% to 50%.

12. The process of claim 11 wherein said imagewise exposing of said photoresistive film is effected by
   (a) placing a mask in contact with photoresistive film on the first major substrate surface said mask having areas defined thereon comprising the patterns for electrically conductive circuitry;
   (b) placing a mask in contact with photoresistive film on the second major substrate surface, said mask having areas defined thereon corresponding to areas of the substrate to be dissolved during chemical milling.

13. The process of claim 11 wherein said chemical milling is performed in a milling solution comprising concentrated aqueous potassium hydroxide.

14. The process of claim 12 wherein said chemical milling is performed in a milling solution comprising concentrated aqueous potassium hydroxide.

15. An article comprising an arsenic free and alkali metal free electroplated composite produced by the process of claim 1.

16. The article of claim 15 wherein one or more of the electroplated metal films are patterned.

17. The article of claim 16 wherein the patterned composite forms a printed circuit board.

18. The article of claim 16 wherein the patterned composite forms a gold plated connector tape useful in the thermocompressive bonding of integrated circuit elements using the Tape Automated Bonding process.

* * * * *

UNITED STATES PATENT AND TRADEMARK OFFICE
CERTIFICATE OF CORRECTION

PATENT NO. : 5,015,538
DATED : May 14, 1991
INVENTOR(S) : Larry J. Krause and Nena M. McCallum It is certified that error appears in the above-identified patent and that said Letters Patent is hereby corrected as shown below:

Column 3, line 57, "crOx" should read --CrOx--.
Column 3, line 57, delete ";" after material and insert --;-- after "CrOx".
Column 5, line 34, "tetraethYl" should read --tetraethyl--.
Column 4, line 51, the formula should read
$--4PIm^- + 2H_2O + O_2 = 4PIm + 4OH^- --$.

Signed and Sealed this

Fourteenth Day of June, 1994

BRUCE LEHMAN

*Attest:*

*Attesting Officer*    Commissioner of Patents and Trademarks